United States Patent [19]
Shiomi et al.

[11] Patent Number: 5,943,555
[45] Date of Patent: Aug. 24, 1999

[54] MICRO MECHANICAL COMPONENT AND PRODUCTION PROCESS THEREOF

[75] Inventors: Hiromu Shiomi; Yoshiki Nishibayashi; Shin-ichi Shikata, all of Itami, Japan

[73] Assignee: Sumitomo Electric Industries, Ltd., Japan

[21] Appl. No.: 08/954,307

[22] Filed: Oct. 17, 1997

Related U.S. Application Data

[62] Division of application No. 08/407,155, Mar. 20, 1995, Pat. No. 5,729,074.

[30] Foreign Application Priority Data

Mar. 24, 1994 [JP] Japan ..................................... 6-054047

[51] Int. Cl.$^6$ ................................................. H01L 21/00
[52] U.S. Cl. ............................... 438/50; 438/52; 438/53; 438/105
[58] Field of Search ................................. 438/50, 52, 53, 438/105

[56] References Cited

U.S. PATENT DOCUMENTS 5,170,668  12/1992  Jones .

FOREIGN PATENT DOCUMENTS

0579405A1  1/1994  European Pat. Off. .

OTHER PUBLICATIONS

Wolf, S. and Tauber, R.N., Silicon Processing for the VLSI Era, Lattice Press, pp. 531–534, 1986.

*Primary Examiner*—John F. Niebling
*Assistant Examiner*—Josetta Jones
*Attorney, Agent, or Firm*—Pennie & Edmonds LLP

[57] ABSTRACT

A micro mechanical component of the present invention comprises a base, and at least one drive portion supported on the base and relatively driving to the base, in which the drive portion is formed from a diamond layer. Thus, because the drive portion has excellent mechanical strength and modulus of elasticity, the operational performance can be greatly improved as a micro mechanical component processed in a fine shape, from the conventional level. Further, because the drive portion exhibits excellent device characteristics under severe circumstances, the range of applications as a micro mechanical component can be widely expanded from the conventional range.

7 Claims, 12 Drawing Sheets

MICRO MECHANICAL COMPONENT AND PRODUCTION PROCESS THEREOF

This is a division of application Ser. No. 08/407,155, filed Mar. 20, 1995, now U.S. Pat. No. 5,729,074.

BACKGROUND OF THE INVENTION

1. Field of the Invention

The present invention relates to a micro mechanical component, which is formed by the fine pattern technology used in fabricating semiconductor integrated circuits and which has advanced functions even if formed in a micro shape, and to a production process thereof.

2. Related Background Art

A variety of micro mechanical components have recently been developed, applying the fine pattern technology fostered as the fabrication technology of semiconductor integrated circuits to semiconductor materials such as silicon. Produced as such micro mechanical components are micro actuators such as gears, valves, and motors, and micro sensors such as pressure sensors, acceleration sensors, and flow rate sensors.

The prior art related to such micro mechanical components is described in detail for example in the reference; "IEEE Transactions on Electron Devices, vol. 39, no. 3, pp. 566–575, March 1992."

SUMMARY OF THE INVENTION

In the above conventional micro mechanical components, normal semiconductor materials are used as constituent materials. The semiconductor materials such as silicon etc. are, however, inferior to the other materials in respect of physical properties such as the mechanical strength and the modulus of elasticity. Thus, the conventional micro mechanical components had a problem that the operational performance thereof was considerably restricted. Besides, surfaces of the semiconductor materials such as silicon etc. are liable to be oxidized and to be eroded by some acids. Thus, the conventional micro mechanical components had a problem that the range of applications thereof was considerably limited.

The present invention has, therefore, been accomplished in view of the above problem, and an object thereof is to provide a micro mechanical component improved well in operational performance and expanded greatly in range of applications, and a production process thereof.

To achieve the above object, a micro mechanical component of the present invention comprises a base and at least one drive portion supported on the base and relatively driving to the base, in which the drive portion is formed of a diamond layer.

The base is preferably formed of a diamond layer. The diamond layer forming the base or the drive portion is preferably a thin film having a thickness of not more than 1 mm. The base is preferably placed on a substrate.

It is also preferred that the two diamond layers constituting the base and the drive portion, respectively, be directly junctioned to each other whereby the base and drive portion are formed as a unity. It is preferred that the diamond layers forming the base and the drive portion, respectively, be junctioned to each other through a thin film of a ceramic material containing a carbide whereby the base and drive portion are formed as a unity. It is preferred that the diamond layers constituting the base and drive portion, respectively, be bonded to each other through a thin film made of a metal carbide whereby the base and drive portion are formed as a unity.

To achieve the above object, a process for producing the micro mechanical component of the present invention comprises a step of depositing a diamond layer on a base, based on vapor phase synthesis, to form at least one drive portion supported on the base and relatively driving to the base.

Preferably, the production process further comprises a step of depositing a diamond layer on a substrate, based on vapor phase synthesis, to form the base. The step of forming the drive portion or the base is preferably a step of forming the diamond layer as a thin film having a thickness of not more than 1 mm.

The step of forming the drive portion or the base preferably comprises a first process of forming a dummy layer having a first shape and a promoting effect on nuclear growth of diamond on the base or the substrate, a second process of depositing a diamond layer having a second shape as inversion of the first shape, on the base or the substrate including the dummy layer, and a third process of removing the dummy layer, based on wet etching.

The first process is preferably a step of forming the dummy layer from a material that causes the nuclear growth of diamond in a nucleation density of not less than $1 \times 10^5$ cm$^{-2}$. The first process is preferably a step of forming the dummy layer from either one of at least one element selected from the group consisting of Mo, Si, Ni, Ti, and W, a carbide of the said element, and $SiO_2$. The first process is preferably a step of forming the dummy layer from either one of a nitride of at least one element selected from the group consisting of Si, Zr, Ti, Al, Ta, and W, a boride of the element, a carbide of the element, an oxide of element, and a boron nitride.

Here is shown a comparison of physical properties between diamond and Si in Table 1.

TABLE 1

COMPARISON OF PHYSICAL PROPERTIES BETWEEN DIAMOND AND Si

| | Si | Diamond | Diamond/Si |
|---|---|---|---|
| Young's Modulus ($10^{11}$Pa) | 1.9 | 10.5 | 5.5 |
| Knoop Hardness (Kg/mm) | 850 | 7000 | 8.2 |
| Yield Strength ($10^9$Pa) | 7 | 50 | 7.1 |
| Thermal Conductivity (W/cm °C.) | 1.57 | 20 | 12.7 |
| Thermal Expansion Coefficient ($10^{-6}$/°C.) | 2.33 | 1.0 | 0.43 |
| Specific Heat (J/mol) | 8.6 | 6.2 | 0.72 |
| Density (g/cm$^3$) | 2.3 | 3.5 | 1.52 |

Generally diamond has a relatively large energy band gap, as large as about 5.5 eV, thus revealing excellent temperature stability and chemical inactivity. Then, comparing it with Si etc., diamond is effective as a material showing excellent device characteristics under severe circumstances, for example at high temperature or under strong radiation.

Further, diamond has a large withstand voltage of about $10^6$ to about $10^7$ V·cm$^{-1}$, large electron mobility and hole mobility of about 2000 cm$^2$·V$^{-1}$·s$^{-1}$ and about 1800 cm$^2$·V$^{-1}$·s$^{-1}$, respectively, a large electron saturation speed of about $2 \times 10^7$ cm·s$^{-1}$, and a small dielectric contact of about 5.7. In addition, the thermal conductivity of diamond is about 20 W·cm$^{-1}$·K$^{-1}$ at room temperature, which is about five times greater than that of Cu and which is the highest among solid substances. Further, the diffusivity of heat is for example as low as about $4.5 \times 10^{-6}$K$^{-1}$ at temperature of 750° C. Thus, comparing with Si etc., diamond is effective as a material exhibiting excellent performance characteristics, for example high frequency and large output.

Further, because diamond has a large Young's modulus of about $10.5 \times 10^{11}$ Pa, the modulus of elasticity thereof is excellent. Therefore, comparing with Si etc., diamond is effective as a material exhibiting excellent mechanical strength even if shaped thinner and finer.

In the micro mechanical component of the present invention, the at least one drive portion supported on the base and relatively driving thereto is formed from diamond. Because of it, the drive portion has excellent mechanical strength and modulus of elasticity, which enhances the operational performance as a micro mechanical component machined in a fine shape, considerably from the conventional level. Since the drive portion reveals the excellent device characteristics under severe circumstances, the range of applications as a micro mechanical component can be expanded greatly from the conventional range.

When the base is formed from diamond, the operational performance and the application range are further improved as a micro mechanical component.

In the process for producing the micro mechanical component of the present invention, diamond is deposited on the substrate, based on the vapor phase synthesis, to form the drive portion, whereby the diamond thin film becomes a dense deposit of small-grain-size crystals. Thus, the drive portion has excellent modulus of elasticity and good mechanical strength even in a thinner and finer shape as compared with when formed of Si. Accordingly, the micro mechanical component can be produced with a largely improved operational performance as compared with the conventional level and with a greatly expanded range of applications as compared with the conventional components.

When the base is formed by depositing diamond on the substrate, based on the vapor phase synthesis, the micro mechanical component can be produced with further improved operational performance and a further expanded range of applications.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

Figure 1:
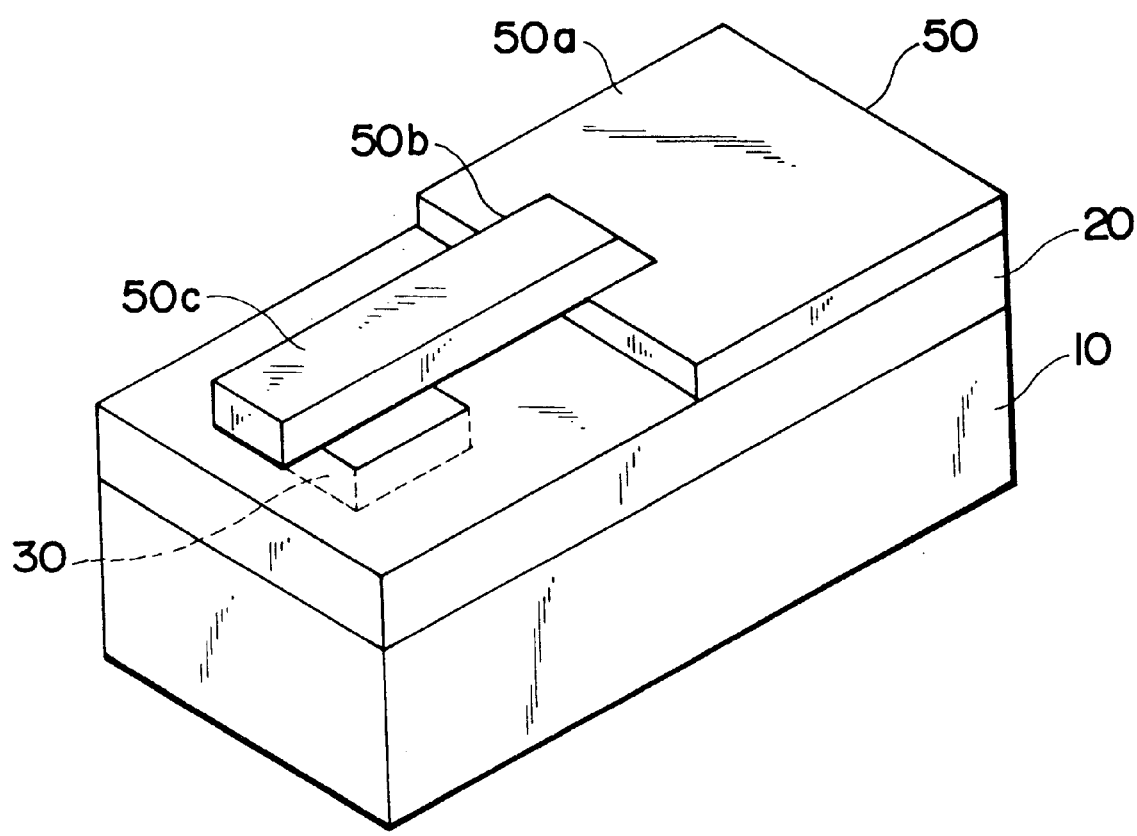
FIG. 1 is a perspective view to show structure of an acceleration sensor in a first embodiment according to the present invention.

The constitution and operation of the embodiments according to the present invention will be described referring to FIG. 1 to FIG. 10I. in the description of the drawings same elements will be denoted by same reference numerals and redundant description will be omitted. It should be noted that dimensional ratios in the drawings do not always coincide with those in the description.

First Embodiment

FIG. 1 is a perspective view to show the structure of the acceleration sensor in the present embodiment. In the acceleration sensor, i-type diamond layer 20 and p-type diamond layer 50 are successively laid on a surface of substrate 10. The i-type diamond layer 20 is formed so that the entire back surface thereof is laid on the top surface of substrate 10. The p-type diamond layer 50 is formed so that a base 50a of a flat plate shape is laid on the surface of the i-type diamond layer 20 and so that a beam 50c of a rectangular prism is set as separate from the surface of the i-type diamond layer 20. Namely, the tail end of beam 50c is integrally formed on the base 50a through a support portion 50b, so that the beam 50c is supported by the support portion 50b like a cantilever with a distal end thereof being free. An electrode layer 30 is buried as exposing its surface in the surface region of the i-type diamond layer 20 below the beam 50c.

The substrate 10 is a chip divided out of a wafer, which is made of a semiconductor material such as Si. The i-type diamond layer 20 is formed by depositing non-doped diamond, based on the CVD (Chemical vapor deposition) process. This i-type diamond layer 20 has a high resistivity in a dopant concentration of about $10^{14}$ cm$^{-3}$, and has a thickness of about 5 μm. The electrode layer 30 is formed by successively depositing Ti/Mo/Au by vapor deposition and thereafter performing annealing. This electrode layer 30 has the thickness of Ti layer of about 20 nm, the thickness of Mo layer of about 20 nm, and the thickness of Au layer of about 100 nm, and has a good ohmic contact property to the i-type diamond layer 20. The p-type diamond layer 50 is formed by depositing diamond doped with B as a p-type dopant, based on the CVD process. This p-type diamond layer 50 has the p-type conductivity in the dopant concentration of about $10^{20}$ cm$^{-3}$ and has the thickness of layer of about 4 μm.

Here is shown the size of the configuration of the acceleration sensor in the present embodiment in Table 2. Tn detail, the size of substrate 10 is about 7 mm in length, about 9 mm in width, and about 1.1 mm in height. The size of beam 50c in the p-type diamond layer 50 is about 4 μm in beam thickness, about 200 μm in beam width, and about 2 mm in beam length. Further, the distance between the electrode layer 30 and the beam 50c, i.e., the gap D between the electrodes (interelectrode gap) is about 4 μm.

TABLE 2

SIZE OF CONFIGURATION OF ACCELERATION SENSOR ACCORDING TO THE INVENTION

| Items | Size |
| --- | --- |
| Chip Size | 7 × 9 × 1.1mm³ |
| Interelectrode Gap D | 4μm |
| Beam Thickness T | 4μm |
| Beam Width B | 200μm |
| Beam Length L | 2mm |

From the viewpoint of expansion of application range, the size of the acceleration sensor thus processed in a fine shape is desirably about 0.1 to 20 mm in length, about 0.1 to 70 mm in width, and about 0.1 to 20 mm in height as a whole, and more precisely, from the viewpoint of securing sufficient mechanical strength, about 5 to 20 mm in length, about 5 to 20 mm in width, and about 5 to 20 mm in height as a whole.

From the viewpoint of expansion of application range, the thickness of each diamond thin film is desirably in the range of about 0.1 μm to abkout 1 mm; more precisely, from the viewpoint of securing sufficient mechanical strength, it is desirably in the range of about 2 μm to about 1 mm.

The electrode layer 30 and p-type diamond layer 50 each are connected to a bridge circuit not shown through respective lines not shown, either. In this bridge circuit the acceleration sensor of the present embodiment is connected in parallel with a capacitor having a fixed capacitance $C_0$.

In such an acceleration sensor, a capacitor is constructed between the electrode layer 30 and the beam 50c. When a stress is loaded from the outside, the electrode layer 30 functions as a fixed electrode integrally fixed together with the i-type diamond layer 20. On the other hand, because the beam 50c is supported on the base 50a through the support portion 50b, it functions as a movable electrode, which is displaced nearly along the direction of film thickness of the i-type diamond layer 20 in response to the stress. Thus, based on the following formula (1), a variable capacitance C of the capacitor changes depending upon an interelectrode distance d between the electrode layer 30 and the beam 50c.

$$C = \epsilon_0 \cdot \epsilon \cdot A / d \quad (1)$$

where C: capacitance of the capacitor;

$\epsilon_0$: dielectric constant in vacuum;

$\epsilon$: relative dielectric constant of an interelectrode insulator;

A: effective area of electrodes;

d: interelectrode distance.

As a result, a bridge impedance changes in the unrepresented bridge circuit, so that an output voltage changes depending upon a capacitance difference between the variable capacitance C and the fixed capacitance $C_0$. Therefore, the stress loaded from the outside to the acceleration sensor can be detected based on the output voltage.

Here, the i-type diamond layer 20 functions as a base fixed on the substrate 10 while the p-type diamond layer 50 functions as a drive portion supported on the base and relatively driving in response to the stress loaded from the outside. These two layers each are formed of a diamond thin film.

Generally, diamond has a relatively large energy band gap, as large as about 5.5 eV, thus revealing excellent temperature stability and chemical inactivity. Then, comparing it with Si etc., diamond is effective as a material showing excellent device characteristics under severe circumstances, for example at high temperature or under strong radiation.

Further, diamond has a large withstand voltage of about $10^6$ to about $10^7$ V·cm⁻¹, large electron mobility and hole mobility of about 2000 cm²·V⁻¹·s⁻¹ and about 1800 cm²·V⁻¹·s⁻¹, respectively, a large electron saturation speed of about $2\times10^7$ cm·s⁻¹, and a small dielectric contact of about 5.7. In addition, the thermal conductivity of diamond is about 20 W·cm⁻¹·K⁻¹ at room temperature, which is about five times greater than that of Cu and which is the highest among solid substances. Further, the diffusivity of heat is for example as low as about $4.5\times10^{-6}$K⁻¹ at temperature of 750° C. Thus, comparing with Si etc., diamond is effective as a material exhibiting excellent performance characteristics, for example high frequency and large output.

Further, because diamond has a large Young's modulus of about $10.5\times10^{11}$ Pa, the modulus of elasticity thereof is excellent. Therefore, comparing with Si etc., diamond is effective as a material exhibiting excellent mechanical strength even if shaped thinner and finer.

Therefore, the p-type diamond layer 50 has excellent mechanical strength and modulus of elasticity as a drive portion, thus greatly enhancing the operational performance as a fine acceleration sensor as compared with the conventional sensors. Since the i-type diamond layer 20 and p-type diamond layer 50 have excellent device characteristics under severe circumstances, the range of applications as a fine acceleration sensor can be considerably expanded as compared with the conventional sensors.

Table 3 shows specifications of an acceleration sensor applied to normal ARS (Antirocked System). On the other hand, Table 4 shows specifications of the acceleration sensor of the present embodiment. Consequently, it can be inferred that the acceleration sensor of the present embodiment readily achieves it under higher-temperature circumstances than heretofore and in a finer shape than heretofore to fully satisfy the required specifications for the acceleration sensor in ARS.

TABLE 3

REQUIRED SPECIFICATIONS FOR ACCELERATION SENSOR FOR ARS

| Items | Characteristic Values |
| --- | --- |
| Detectable Acceleration | −1~+1G |
| Operational Temperature | −30~70° C. |
| Storage Temperature | −40~85° C. |
| Zero Voltage | 2.2V |
| Sensitivity | 0.825V/G |
| Frequency Characteristics | DC~10Hz |

TABLE 4

SPECIFICATIONS OF ACCELERATION SENSOR ACCORDING TO THE INVENTION

| Items | Characteristic Values |
| --- | --- |
| Detectable Acceleration | −2~+2G |
| Operational Temperature | −40~500° C. |
| Storage Temperature | −40~90° C. |
| Zero Voltage | 2.5V |
| Sensitivity | 2.0V/G |
| Nonlinearity | <2%FS |
| Hysteresis | <1%FS |

The production process of the present embodiment is next described.

Figure 2A:
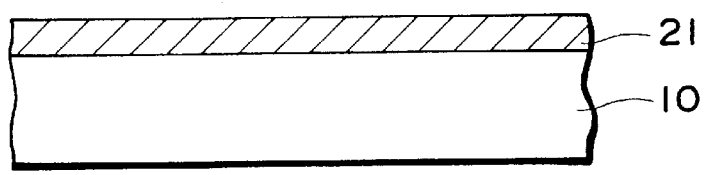
FIG. 2A to FIG. 2F are cross sections to show production steps of the acceleration sensor of FIG. 1 in order.

FIG. 2A to FIG. 2F are cross sections to show production steps of the acceleration sensor in the present embodiment in order. First, based on the normal CVD process, a wafer or a chip separated out of a wafer is set as the substrate 10 inside a chamber, the atmosphere in the chamber is set to the pressure of about 40 Torr, and the temperature of substrate 10 is set to about 930° C. Subsequently, $H_2$ of concentration 99.9999% and $CH_4$ of concentration 99.9999% are supplied as reaction gases into the chamber at a flow rate of about 200 sccm (Standard Per Cubic Centimeter) and at a flow rate of about 1 sccm, respectively. Then a thermochemical reaction is induced over the surface of substrate 10 by RF radiation of frequency about 2.45 GHz and power about 400 W, thereby forming an i-type diamond layer 21 on the surface of substrate 10 (FIG. 2A).

Here is shown substrate material dependence in nucleation of diamond in Table 5. When diamond is deposited on a substrate made of a metal other than Mo, based on the normal CVD process, it is difficult to form a thin film in a layer structure, because the nucleation density is generally relatively small. In contrast, when diamond is deposited on a substrate made of Si or Mo, based on the normal CVD process, a thin film in a layer structure can be readily formed, because the nucleation density thereof is relatively large.

In experiments of depositing diamond on a substrate, based on the CVD process, such a result was obtained that the nucleation density was increased by applying a bias voltage to the substrate. For example, using the substrates made of the materials listed in Table 5, the nucleation densities of diamond were increased some hundred times.

TABLE 5

SUBSTRARE MATERIAL DEPENDENCE OF DIAMOND NUCLEATION

| Material for Substrate | Nucleation Density (cm$^{-2}$) |
|---|---|
| Silicon | $1 \times 10^{11}$ |
| Molybdenum | $2 \times 10^{12}$ |
| Nickel | $1 \times 10^{6}$ |
| Titanium | $1 \times 10^{7}$ |
| Glass | $2 \times 10^{5}$ |
| Tungsten | $1 \times 10^{9}$ |

The technology concerning such a CVD process is described in detail for example in the reference; "Japanese Journal of Applied Physics, vol. 29, no. 1, pp. 34–40, January 1990."

Figure 2B:
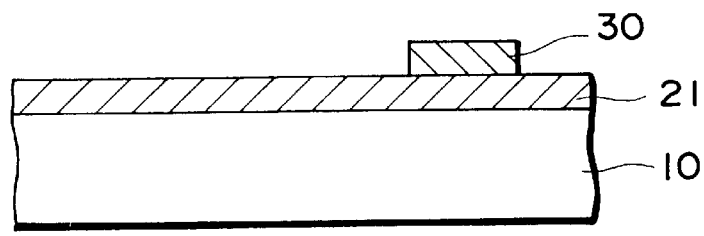

Next, based on the normal resistance heating evaporation process, the wafer or chip is set inside a heating furnace and the atmosphere inside the heating furnace is set to the temperature of about 100° C. Subsequently, Ti, Mo, and Au are successively introduced into the heating furnace to be successively deposited in layers in a predetermined region of surface on the i-type diamond layer 21. Then annealing is conducted in vacuum to form an electrode layer 30 (FIG. 2B).

Figure 2C:
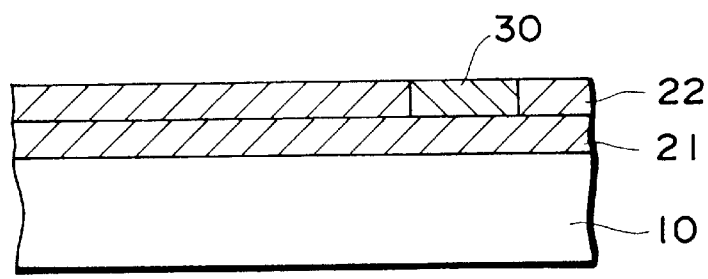

Next, based on the normal CVD process, the wafer or chip is again set inside the chamber, the atmosphere in the chamber is set to the pressure of about 40 Torr, and the temperature of substrate 10 to about 930° C. Subsequently, $H_2$ of concentration 99.9999% and $CH_4$ of concentration 99.9999% are supplied as reaction gases into the chamber at a flow rate of about 200 sccm and at a flow rate of about 1 sccm, respectively. Then a thermochemical reaction is induced over the surface of the i-type diamond layer 21 by RF radiation of frequency about 2.45 GHz and power about 400 W, thereby forming an i-type diamond layer 22 on the surface of the i-type diamond layer 21 so as to cover side walls of the electrode layer 30 while exposing the surface of the electrode layer 30 (FIG. 2C). In the following description, the i-type diamond layers 21, 22 are called as the i-type diamond layer 20 as a whole.

Figure 2D:
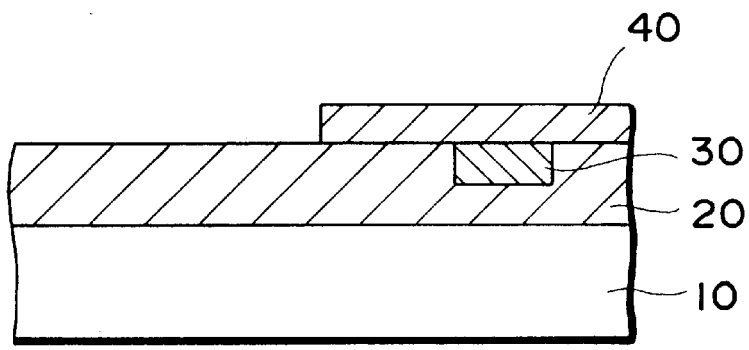

Next, based on the normal resistance heating evaporation process, the wafer or chip is again set inside the heating furnace and the atmosphere in the heating furnace is set to the temperature of about 100° C. Subsequently, molybdenum or a silicon nitride is introduced into the heating furnace to be deposited in a surface region of the i-type diamond layer 22 including the surface of electrode layer 30, thereby forming a dummy layer 40 having a thickness coincident with the predetermined interelectrode gap D. Then, based on the normal photolithography technology, a mask layer of $SiO_2$ is formed in a predetermined pattern on thesurface of the dummy layer 40. Then, based on the normal RIE (Reactive Ion Etching) process, the wafer or chip is set inside an etching container, the atmosphere inside the etching container is set to the pressure of about 0.02 Torr, and the temperature of substrate 10 to about 30° C. Subsequently, Ar of concentration abut 100% and $O_2$ of concentration about 100% are supplied as etching gases into the etching container at a flow rate of about 100 sccm and at a flow rate of about 1 sccm, respectively. Then a chemical reaction is induced over the surface of the dummy layer 40 by RF radiation of frequency about 1.356 MHz and power about 100 W, thereby removing predetermined regions of the dummy layer 40 not covered with the mask material (FIG. 2D).

Figure 2E:
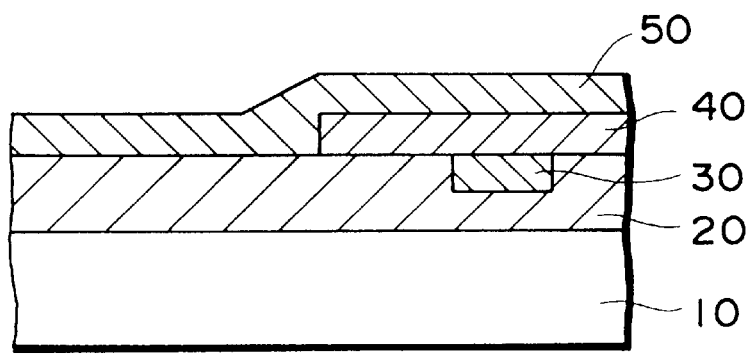

Next, based on the normal CVD process, the wafer or chip is again set inside the chamber, the atmosphere in the chamber is set to the pressure of about 40 Torr, and the temperature of substrate 10 to about 930° C. Subsequently, $H_2$ of concentration 99.9999%, $CH_4$ of concentration 99.9999%, and $B_2H_6$ (diborane) of volume ratio 1000 ppm are supplied as reaction gases into the chamber at a flow rate of about 200 sccm, at a flow rate of about 1 sccm, and at a flow rate of about 1 sccm, respectively. Then a thermochemical reaction is induced over the surface of the i-type diamond layer 20 by RF radiation of frequency about 2.45 GHz and power about 400 W, thereby forming a p-type diamond layer 50 over the surfaces of the i-type diamond layer 20 and dummy layer 40 (FIG. 2E).

Figure 2F:
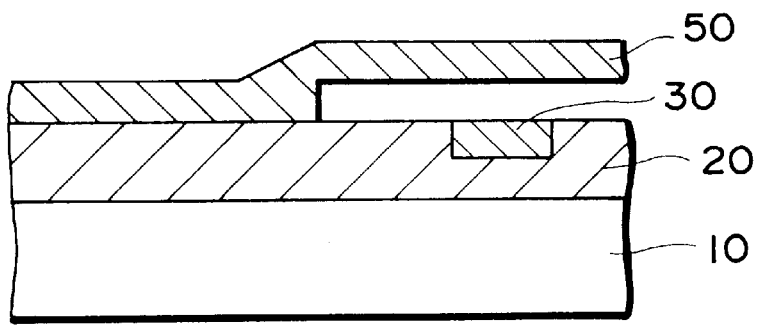

Next, based on the normal photolithography technology, a mask layer of $SiO_2$ is formed in a predetermined pattern on the surface of the p-type diamond layer 50. Subsequently, based on the normal RIE process, the wafer or chip is set inside the etching container, the atmosphere in the etching container is set to the pressure of about 0.02 Torr, and the temperature of substrate 10 to about 20° C. Then Ar of concentration about 100% and $O_2$ of concentration about 100% are supplied as etching gases into the etching container at a flow rate of about 100 sccm and at a flow rate of about 1 sccm, respectively. After that, a chemical reaction is induced over the surface of the p-type diamond layer 50 by RF radiation of frequency about 1.356 MHz and power about 100 W to remove the surface region of the p-type diamond layer 50 not covered with the mask material, thereby forming the beam 50c. Then, based on the normal wet etching process,the wafer or chip is immersed in a HF base etchant to remove the dummy layer 40. Subsequently, the unrepresented lines for connecting the bridge circuit not shown to the electrode layer 30 and to the p-type diamond layer 50 are formed so as to complete the acceleration sensor (FIG. 2F).

Here, a volume ratio of $O_2$ to Ar in the etching gases is desirably about 1%. In this case, an etch selectivity of the p-type diamond layer 50 to the mask material of $SiO_2$ is about 40 times, and an etch rate thereof is about 15 nm/min.

The technology concerning the RIE process is described in detail for example in the reference; "2nd International Conference on the Applications of Diamond Films and Related Materials, pp. 377–380, 1993."

By the process for producing the acceleration sensor as described above, the i-type diamond layer 20 and p-type diamond layer 50 are formed based on the CVD process using the reaction gases of $CH_4$ and $H_2$, whereby these diamond thin films are densely deposited in the form of small-grain-size crystals. Therefore, the i-type diamond layer 20 and p-type diamond layer 50 each have excellent modulus of elasticity and show good mechanical strength even in a thinner and finer shape as compared with when they are made of Si. Accordingly, the micro acceleration sensor can be produced with highly improved operational performance from the conventional level and with a greatly expanded range of applications from the conventional range.

Experiments in the present embodiment are next described.

Using a bridge circuit as described below, output characteristics were measured of the acceleration sensor of the present embodiment.

Figure 3:
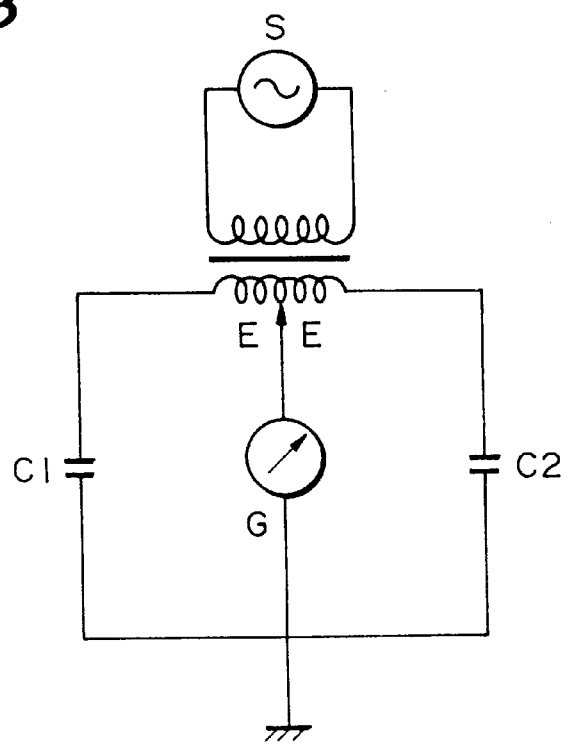
FIG. 3 is a circuit diagram to show structure of a bridge circuit for detecting a variable capacitance in the acceleration sensor of FIG. 1.

FIG. 3 is a circuit diagram to show structure of the bridge circuit for detecting a variable capacitance in the acceleration sensor of the present embodiment. In a transformer of this bridge circuit, one coil is connected to a power supply S while the other coil is earthed through capacitors $C_1$, $C_2$ and a galvanometer G. Thus, when an electromotive force E is induced in the transformer by an alternating current generated from the power supply S, an electric current flows through the capacitors $C_1$, $C_2$ and galvanometer G.

Here, the acceleration sensor of the present embodiment having the variable capacitance C was connected as the capacitor $C_1$ and a capacitor having a fixed capacitance $C_0$ as the capacitor $C_2$. Then, detecting an output voltage based on a bridge impedance changing depending upon a capacitance difference between the variable capacitance C and the fixed capacitance $C_0$, a stress loaded from the outside to the acceleration sensor was measured.

Figure 4:
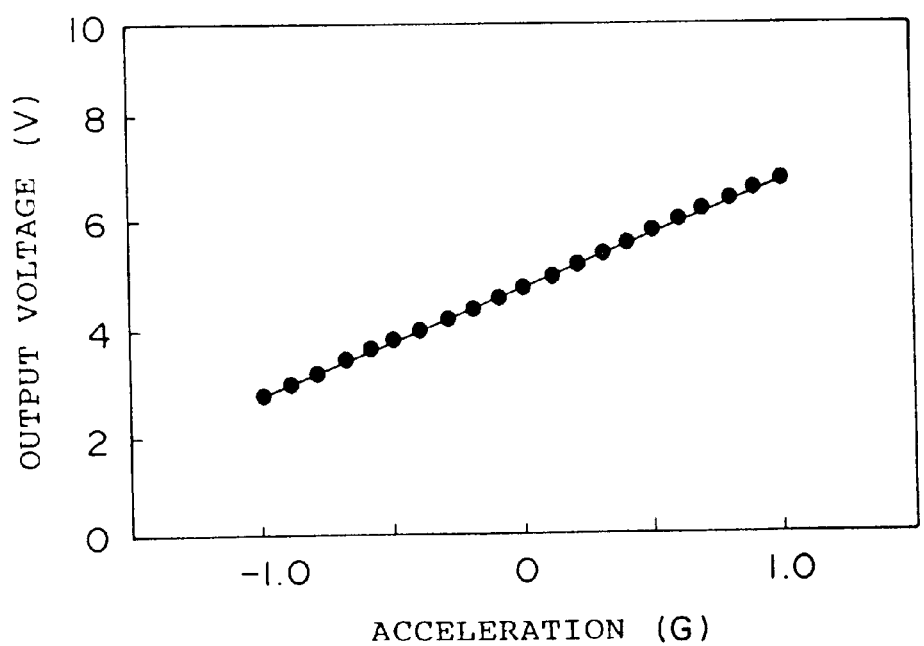
FIG. 4 is a graph to show output characteristics of acceleration detection in the acceleration sensor of FIG. 1.

FIG. 4 is a graph to show output characteristics of acceleration detection in the acceleration sensor of the present embodiment. Here, the horizontal axis represents the acceleration of the stress loaded on the acceleration sensor and the vertical axis the output voltage detected by the bridge circuit as described above. From the results, it is seen that the output characteristics of the acceleration sensor showed good linearity to the acceleration and the sensitivity of the acceleration sensor was 2.0 V·$G^{-1}$.

Figure 5:
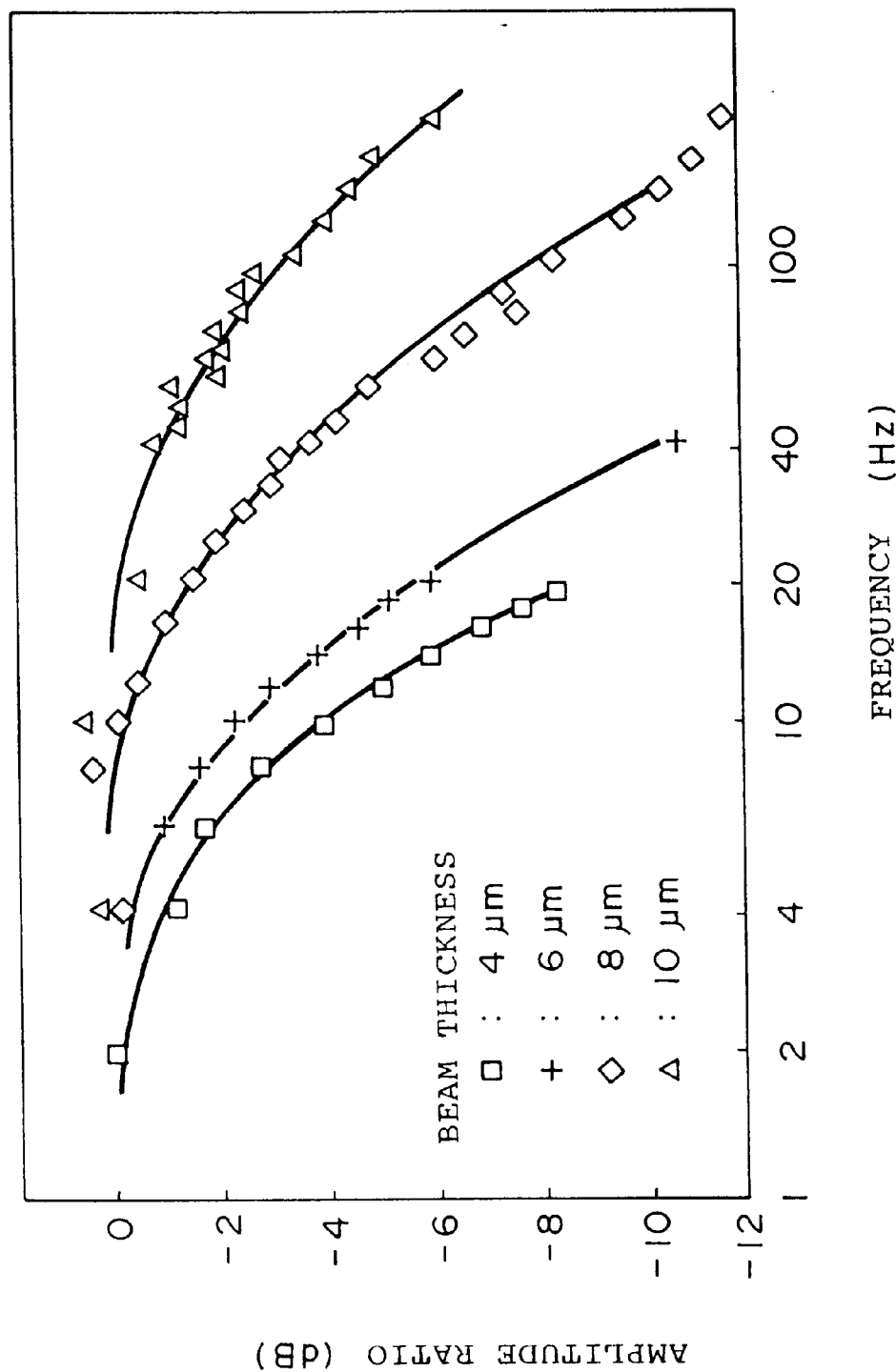
FIG. 5 is a graph to show beam thickness dependence of frequency-amplitude ratio characteristics in the acceleration sensor of FIG. 1.

FIG. 5 is a graph to show beam thickness dependence of frequency-amplitude ratio characteristics in the acceleration sensor of the present embodiment. Here, the horizontal axis represents the frequency of the stress loaded on the acceleration sensor, and the vertical axis the ratio of attenuation with reference of the maximum amplitude in displacement of the beam in the acceleration sensor.

Here, the frequency-amplitude ratio characteristics were measured for four kinds of acceleration sensors, in which the beam thickness was set to about 4 $\mu$m, about 6 $\mu$m, about 8 $\mu$m, or about 10 $\mu$m. As a result, cut-off frequencies of the acceleration sensors were not less than about 10 Hz, thus obtaining the frequency characteristics to satisfy the cut-off frequency required by ARS even in one-tenth beam thickness as compared with when the beam is made of Si. Since the cut-off frequency of the acceleration sensor is improved more as the beam thickness increases, it can be inferred that the frequency characteristics to satisfy the cut-off frequency of not less than about 200 Hz required for active anti-vibration system can be achieved.

Further, the frequency-amplitude raio characteristics were measured for a plurality of experimental example formed as two kinds of acceleration sensors, in which the beam was formed by using the dummy layer of molybdenum or a silicon nitride. As a result, a dispersion between the frequency-amplitude ratio characteristics of experimental examples, which was formed by using the dummy layer of silicon nitride, was smaller than that of experimental examples, which was formed by using the dummy layer of molybdenum. Since the nucleation density of diamond deposited on the dummy layer of silicon nitride, based on the CVD process, is bigger than that of diamond deposited on the dummy layer of molybdenum, it can be inferred that a structure of the diamond layer formed on the dummy layer of silicon nitride is more homogeneous than that of the diamond layer formed on the dummy layer of molybdenum. For example, it can be inferred that the diamond layer having more homogeneous structure than the conventional structure, using the dummy layer made of the materials listed in Table 6.

TABLE 6

DUMMY LAYER MATERIAL DEPENDENCE OF DIAMOND NUCLEATION

| Dummy Layer Material | Nucleation Density ($cm^{-2}$) |
| --- | --- |
| Silicon Oxide | $2 \times 10^5$ |
| Silicon Nitride | $2 \times 10^{13}$ |
| Titanium Nitride | $1 \times 10^{10}$ |
| Zirconium Nitride | $1 \times 10^{10}$ |
| Zirconium Oxide | $1 \times 10^4$ |
| Tungsten Carbide | $1 \times 10^9$ |

Second Embodiment

Figure 6:
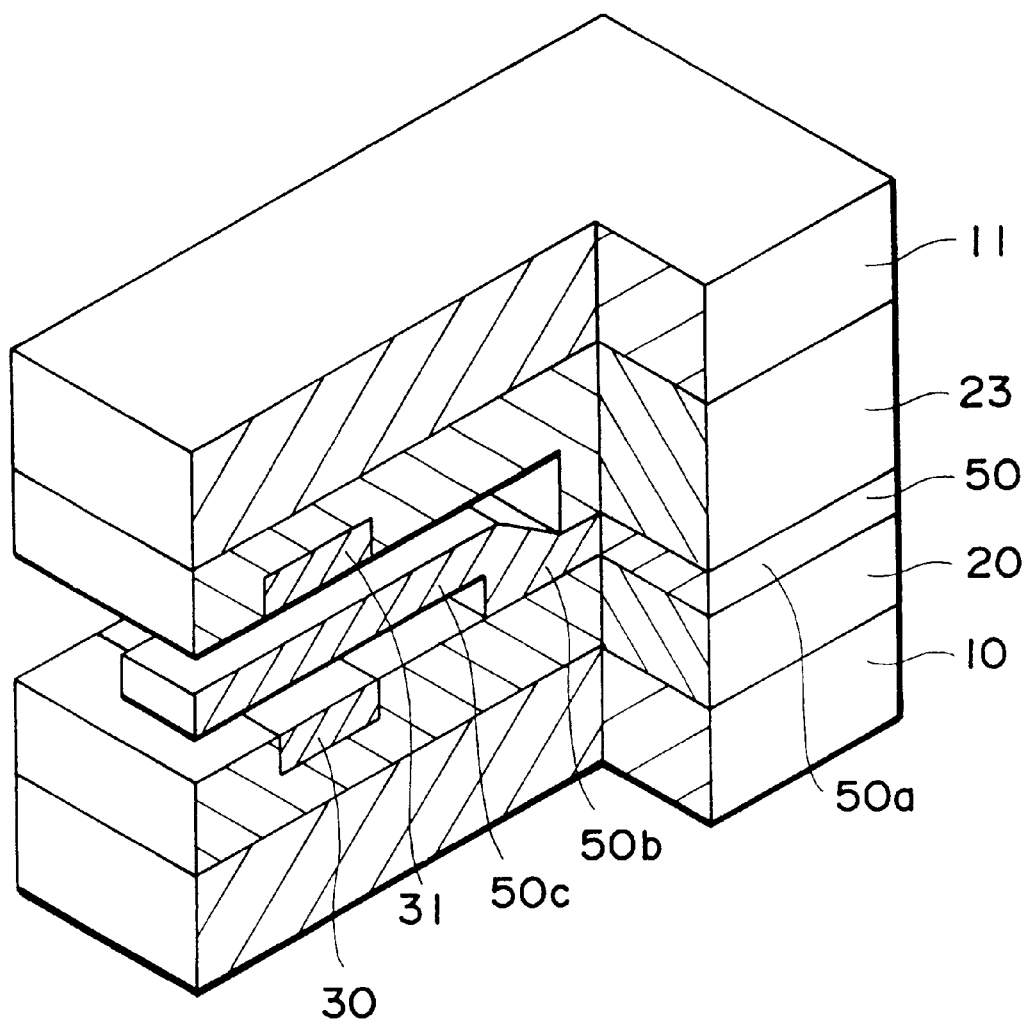
FIG. 6 is a perspective view to show structure of another acceleration sensor in a second embodiment according to the present invention.

FIG. 6 is a perspective view, partly broken, to show structure of another acceleration sensor of the present embodiment. In this acceleration sensor, i-type diamond layer 23 and substrate 11 are successively laid on the surface of base 50a of p-type diamond layer 50 in the acceleration sensor of the first embodiment as described above. The i-type diamond layer 23 is junctioned to the base 50a so that a projection in the back surface of the laser 23 is in contact with the top surface of base 50a and so that a recess portion in the back surface is apart from the surface of beam 50c. Namely, the distal end of beam 50c can be displaced in a gap between the i-type diamond layers 20, 23. The substrate 11 is formed in such a manner that the entire back surface thereof is placed on the surface of i-type diamond layer 23. An electrode layer 31 is buried as exposing the surface thereor in the surface region of i-type diamond layer 23 above the beam 50c.

The substrate 11 is a chip separated out from a wafer, similarly as the substrate 10, and is made of a semiconductor material such as Si. The i-type diamond layer 23 is formed by depositing non-doped diamond by the CVD process, similarly as the i-type diamond layer 20. This i-type diamond layer 23 has a high resistance in dopant concentration of about $10^{14}$ $cm^{-3}$ and has a film thickness of about 5 $\mu$m. The electrode layer 31 is formed, similarly as the electrode layer 30, by successively building up Ti/Mo/Au by vapor deposition and thereafter performing annealing. This electrode layer 31 has a film thickness of Ti of about 20 nm, a film thickness of Mo of about 20 nm, and a film thickness of Au of about 100 nm, and has a good ohmic contact property to the i-type diamond layer 23.

Here, a distance between either one of the two electrode layers 30, 31 and the beam 50c of the i-type diamond layer 50, that is, the interelectrode gap D is about 4 μm. The electrode layers 30, 31 and p-type diamond layer 50 each are connected to a bridge circuit not shown through lines not shown, either. In this bridge circuit the acceleration sensor is incorporated as two differential capacitors with respective variable capacitances C, C' connected in parallel.

In such an acceleration sensor, two capacitors are constructed between the electrode layers 30, 31 and the beam 50c. When an external stress is loaded thereon, the electrode layers 30, 31 function as fixed electrodes as integrally fixed with the respective i-type diamond layers 20, 23. On the other hand, because the beam 50c is supported on the base 50a through the supporting portion 50b, it functions as a movable electrode, which can be displaced substantially along the direction of the film thickness of i-type diamond layers 20, 23 in response to the stress.

For example, suppose the x axis is set as a coordinate axis along the film thickness direction going from the i-type diamond layer 20 to the i-type diamond layer 23, C is the variable capacitance of the capacitor located between the electrode layer 30 and the beam 50c, and C' is the variable capacitance of the capacitor between the electrode layer 31 and the beam 50c. If the beam 50c approaches the i-type diamond layer 23 by a displacement x, the variable capacitances C, C' of the two capacitors change based on the following two formulae (2a) and (2b).

$$C = \epsilon_0 \cdot \epsilon \cdot A/(D+x) \quad (2a)$$

$$C' = \epsilon_0 \cdot \epsilon \cdot A/(D-x) \quad (2b)$$

Also, if the beam 50c approaches the i-type diamond layer 20 by a displacement x, the variable capacitances C, C' of the two capacitors change based on the following two formulae (3a) and (3b).

$$C = \epsilon_0 \cdot \epsilon \cdot A/(D-x) \quad (3a)$$

$$C' = \epsilon_0 \cdot \epsilon \cdot A/(D+x) \quad (3b)$$

As a result, the bridge impedance changes in the unrepresented bridge circuit not shown, so that an output voltage thereof varies depending upon a capacitance difference between the variable capacitors C, C'. Thus, based on this output voltage, the external stress loaded on the acceleration sensor can be detected.

Here, the i-type diamond layer 20, 23 functions as a base fixed to the substrate 10, 11, respectively, while the p-type diamond layer 50 functions as a drive portion supported on the bases and relatively driving thereto in correspondence to the externally loaded stress. These layers each are formed of a diamond thin film.

Similarly as in the first embodiment, the p-type diamond layer 50 has excellent mechanical strength and modulus of elasticity as a drive portion, greatly improving the operational performance as a micro acceleration sensor from the conventional level accordingly. Since the i-type diamond layers 20, 23 and p-type diamond layer 50 have excellent device characteristics under severe circumstances, the range of applications as a micro acceleration sensor can be greatly expanded from the conventional range.

A process for producing the present embodiment is next described.

Figure 7A:
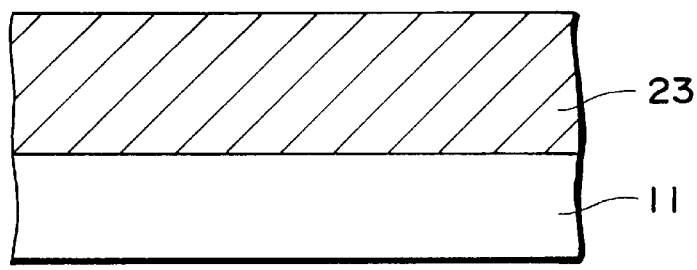
FIG. 7A to FIG. 7E are cross sections to show production steps of the acceleration sensor of FIG. 6 in order.

FIG. 7A to FIG. 7E are cross sections to show production steps of the acceleration sensor of the present embodiment in order. First, based on the normal CVD process, a wafer or a chip separated out from a wafer is set as the substrate 11 inside the chamber, the atmosphere in the chamber is set to the pressure of about 40 Torr, and the temperature of substrate 11 is set to about 930° C. Subsequently, $H_2$ of concentration 99.9999% and $CH_4$ of concentration 99.9999% are supplied as reaction gases at a flow rate of about 200 sccm and at a flow rate of about 1 sccm, respectively, into the chamber. Then a thermochemical reaction is induced over the surface of substrate 11 by RF radiation of frequency about 2.45 GHz and power about 400 W, thereby forming the i-type diamond layer 23 on the surface of substrate 11 (FIG. 7A).

Next, based on the normal photolithography technology, a mask layer of $SiO_2$ is formed in a predetermined pattern over the surface of the i-type diamond layer 23. Subsequently, based on the normal RIE process, the wafer or chip is set inside the etching container, the atmosphere in the etching container is set to the pressure about 0.02 Torr, and the temperature of substrate 11 to about 20° C. Then Ar of concentration about 100% and $O_2$ of concentration about 100% are supplied as etching gases at a flow rate of about 100 sccm and at a flow rate of about 1 sccm, respectively, into the etching container. Then a chemical reaction is induced over the surface of the i-type diamond layer 23 by RF radiation of frequency about 1.356 MHz and power about 100 W, thereby removing the surface region of the i-type diamond layer 23 not covered with the mask material, in the depth corresponding to the predetermined interelectrode gap D.

Here, the volume percentage of $O_2$ to Ar in the etching gases is preferably about 1%. On this occasion, an etched surface of the i-type diamond layer 23 becomes considerably flat. Also, the etch selectivity of the i-type diamond layer 23 to the mask material of $SiO_2$ is about 40 times, and the etch rate is about 15 nm/min.

Figure 7B:
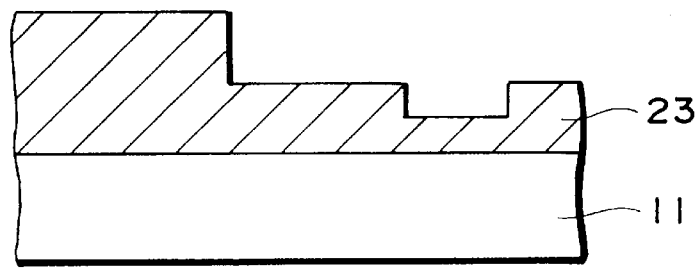

Next, based on the normal photolithography technology, a mask layer of $SiO_2$ is formed in a predetermined pattern except for above a predetermined region of the etched surface of the i-type diamond layer 23. Subsequently, based on the normal RIE process, the wafer or chip is again set inside the etching container, the atmosphere in the etching container is set to the pressure of about 0.02 Torr, and the temperature of substrate 11 to about 20° C. Then Ar of concentration about 100% and $O_2$ of concentration about 100% are supplied as etching gases at a flow rate of about 100 sccm and at a flow rate of about 1 sccm, respectively, into the etching container. Then a chemical reaction is induced over the surface of the i-type diamond layer 23 by RF radiation of frequency about 1.356 MHz and power about 100 W, thereby removing the surface region of the i-type diamond layer 23 not covered with the mask material, in the depth corresponding to the predetermined thickness of the electrode layer (FIG. 7B).

Figure 7C:
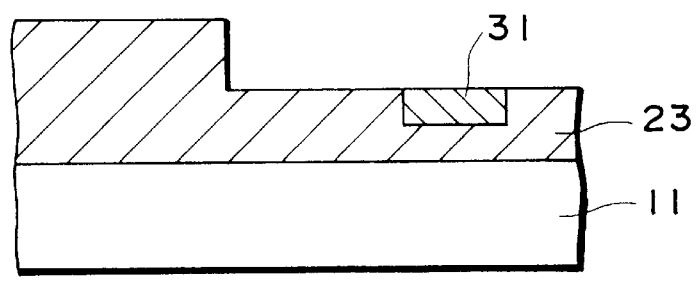

Next, based on the normal resistance heating evaporation process, the wafer or chip is set inside the heating furnace, and the atmosphere in the heating furnace is set to the temperature of about 100° C. Then Ti, Mo, and Au are successively introduced into the heating furnace to be deposited in successive layers in a predetermined region of the i-type diamond layer 23. Then performing annealing in vacuum, the electrode layer 31 is formed (FIG. 7C).

Figure 7D:
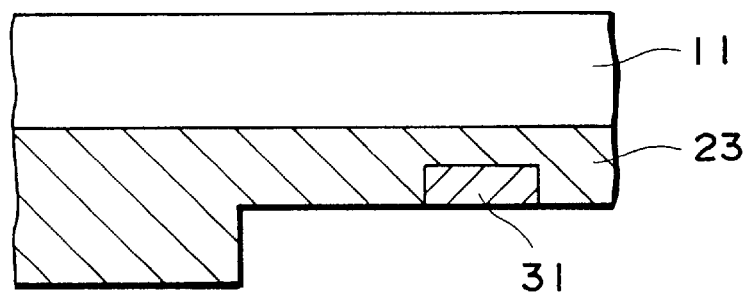

Next, the wafer or chip is set inside a vacuum container, and the wafer or chip is inverted up and down therein (FIG. 7D).

Figure 7E:
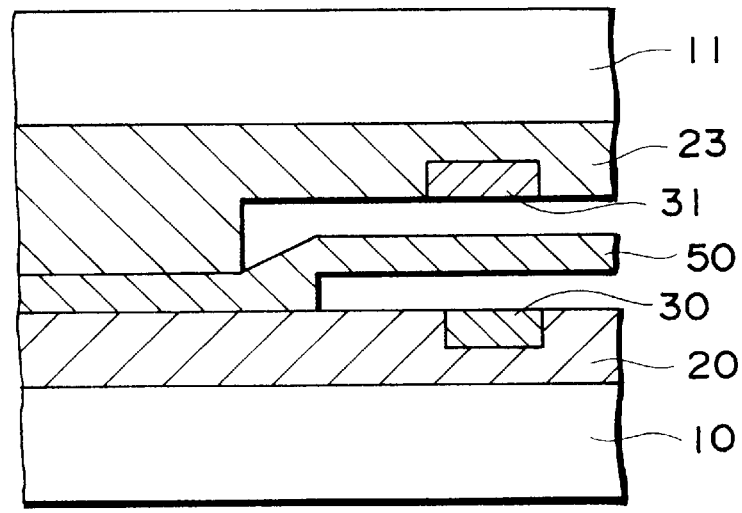

Next, the acceleration sensor of the first embodiment is set inside the vacuum container and the projection of the i-type diamond layer 23 is placed on the base 50a of the p-type diamond layer 50. Subsequently, based on the normal direct coupling method, the atmosphere in the vacuum container is set to the pressure of about $10^{-9}$ Torr and the temperature of about 1000° C. to junction the p-type diamond layer 50 to the i-type diamond layer 23 (FIG. 7E).

Here, the coupling between the p-type diamond layer 50 and the i-type diamond layer 23 may also be made in such a manner that a thin film having a clean surface, for example of a ceramic material containing a carbide such as silicon carbide, titanium carbide, and molybdenum carbide, or a readily carbidized metal such as titanium and molybdenum, is formed on at least one of surfaces of the base 50a of the p-type diamond layer 50 and the projection of the i-type diamond layer 23 and that thereafter, based on the normal indirect coupling method, the atmosphere in the vacuum container is set to the pressure of about 100 Torr and the temperature of about 50° C., thus effecting coupling.

According to the process for producing the acceleration sensor, the p-type diamond layer 50 and the i-type diamond layer 23 are formed based on the CVD process using the reaction gases of $CH_4$ and $H_2$, so that these diamond thin films are densely deposited in the form of small-grain-size crystals, thus having clean surfaces with hydrogen atoms at terminals. Therefore, the base 50a of the p-type diamond layer 50 can be junctioned to the projection of the i-type diamond layer 23, based on the direct coupling method, whereby assembly can be done under control with high accuracies including the accuracy of the interelectrode gap D of the capacitor consisting of the electrode layer 31 and the p-type diamond layer 50.

Experiments of the present embodiment are next described.

Using the bridge circuit shown in FIG. 4, output characteristics in the acceleration sensor of the present embodiment were measured. In the measurement, the acceleration sensor having the variable capacitance C is connected as the capacitor $C_1$ and the capacitor having the variable capacitance C' as a capacitor $C_2$. Then stress externally loaded on the acceleration sensor was measured by detecting an output voltage based on the bridge impedance varying in response to the capacitance difference between the variable capacitances C, C'. The measurement showed that the sensitivity of the acceleration sensor was 3.0 $VG^{-1}$.

Third Embodiment

Figure 8:
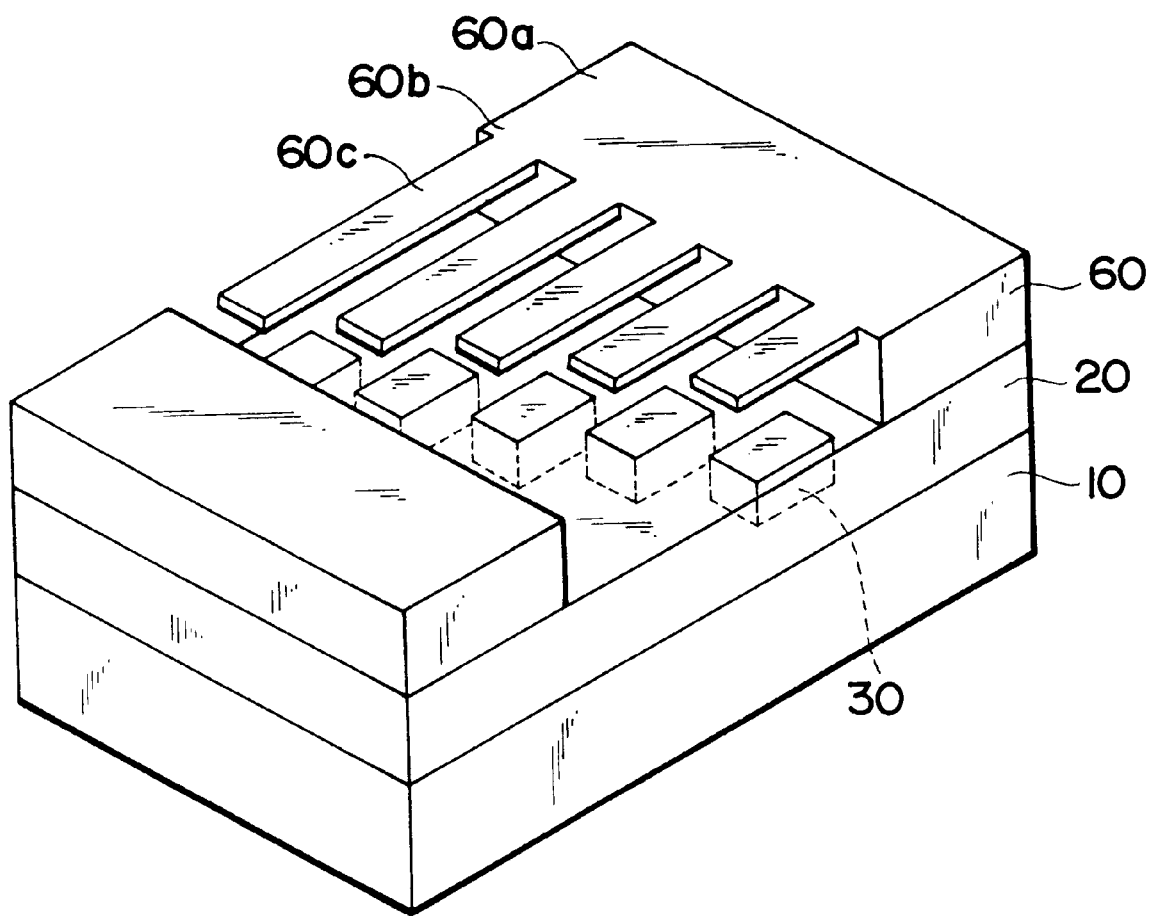
FIG. 8 is a perspective view to show structure of a frequency analyzer in a third embodiment according to the present invention.

FIG. 8 is a perspective view to show a frequency analyzer of the present embodiment. In the frequency analyzer, the substrate 10 and i-type diamond layer 20 are formed substantially in the same manner as in the acceleration sensor of the first embodiment. However, a p-type diamond layer 60 is formed on the surface of the i-type diamond layer 20. This p-type diamond layer 60 is formed in such an arrangement that a base 60a of a flat plate is placed on the top surface of the i-type diamond layer 20 and that rectangular prism beams 60c are set apart from the surface of the i-type diamond layer 20. Namely, tail ends of the beams 60c are integrally formed with the base 60a through respective supporting portions 60b, so that the supporting portions 60b support the associated beams 60c in a cantilever form with distal ends being free. Further, five electrode layers 30 are buried as exposing respective surfaces in the surface region of the i-type diamond layer 20 below the five corresponding beams 60c.

The p-type diamond layer 60 is formed by depositing diamond doped with B as a p-type dopant, based on the CVD process. This p-type diamond layer 60 has the p-type conduction in dopant concentration of about $10^{20}$ $cm^{-3}$ and has a film thickness of about 4 μm. Sizes of the five beams 60c are about 0.2 to about 20 μm in beam thickness, about 200 μm in beam width, and about 0.5 to about 2.0 mm in beam length. A distance between the five pairs of the electrode layers 30 and beams 60c, that is, the interelectrode gap D is about 4 μm. Further, the electrode layers 30 and p-type diamond layer 60 each are connected to a bridge circuit not shown through respective lines not shown, either.

In such a frequency analyzer, a capacitor is formed between each electrode layer 30 and each beam 60c opposed thereto. These beams 60c have mutually different beam thicknesses and beam lengths. Therefore, when an external stress is loaded thereon, each capacitor functions as a vibration sensor to show peculiar frequency characteristics, thus enabling frequency analysis of stress.

Here, the i-type diamond layer 20 functions as a base fixed to the substrate 10 while the p-type diamond layer 60 functions as a drive portion supported on the base and relatively driving thereto in response to the externally loaded stress. These layers each are formed of a diamond thin film.

Similarly as in the first embodiment, because the p-type diamond layer 60 has excellent mechanical strength and modulus of elasticity as a drive portion, the operational performance as a micro frequency analyzer can be greatly improved from the conventional level accordingly. Since the i-type diamond layer 20 and p-type diamond layer 60 have excellent device characteristics under severe circumstances, the range of applications as a micro frequency analyzer can be widely expanded.

A process for producing the present embodiment is next described.

The frequency analyzer of the present embodiment can be produced substantially in the same manner as in the first embodiment except for formation of the p-type diamond layer 60. The formation of the p-type diamond layer 60 is carried out in the following manner.

First, the i-type diamond layer 20, electrode layers 30, dummy layer not shown, and p-type diamond layer 60 are formed on the surface of substrate 10, which is a wafer or a chip separated out from a wafer, substantially in the same manner as in the first embodiment.

Next, based on the normal photolithography technology, a mask pattern of $SiO_2$ is formed in a comb pattern on the p-type diamond layer 60. Subsequently, based on the normal RIE process, the wafer or chip is set inside the etching container, the atmosphere in the etching container is set to the pressure of about 0.02 Torr, and the temperature of substrate 10 is set to about 30° C. Then Ar of concentration about 100% and $O_2$ of concentration about 100% are supplied as etching gases at a flow rate of about 100 sccm and at a flow rate of about 1 sccm, respectively, into the etching container. Then a chemical reaction is induced over the surface of the p-type diamond layer 60 by RF radiation of frequency about 1.356 MHz and power about 100 W to remove the surface region of p-type diamond layer 60 not covered with the mask layer, thereby forming the beams 60c.

Next, based on the normal wet etching process, the wafer or chip is immersed in a HF base etchant to remove the dummy layer not shown. Subsequently, lines not shown are formed to connect the bridge circuit not shown to the electrode layers 30 and the p-type diamond layer 60, thus completing the frequency analyzer.

Next, experiments of the present invention are described.

Using the bridge circuit shown in FIG. 4, frequency characteristics were measured in the frequency analyzer of the present embodiment. The measurement showed that the cut-off frequency was 1000 Hz in a vibration sensor portion where the beam thickness of beam 60c was about 5 μm.

Fourth Embodiment

Figure 9:
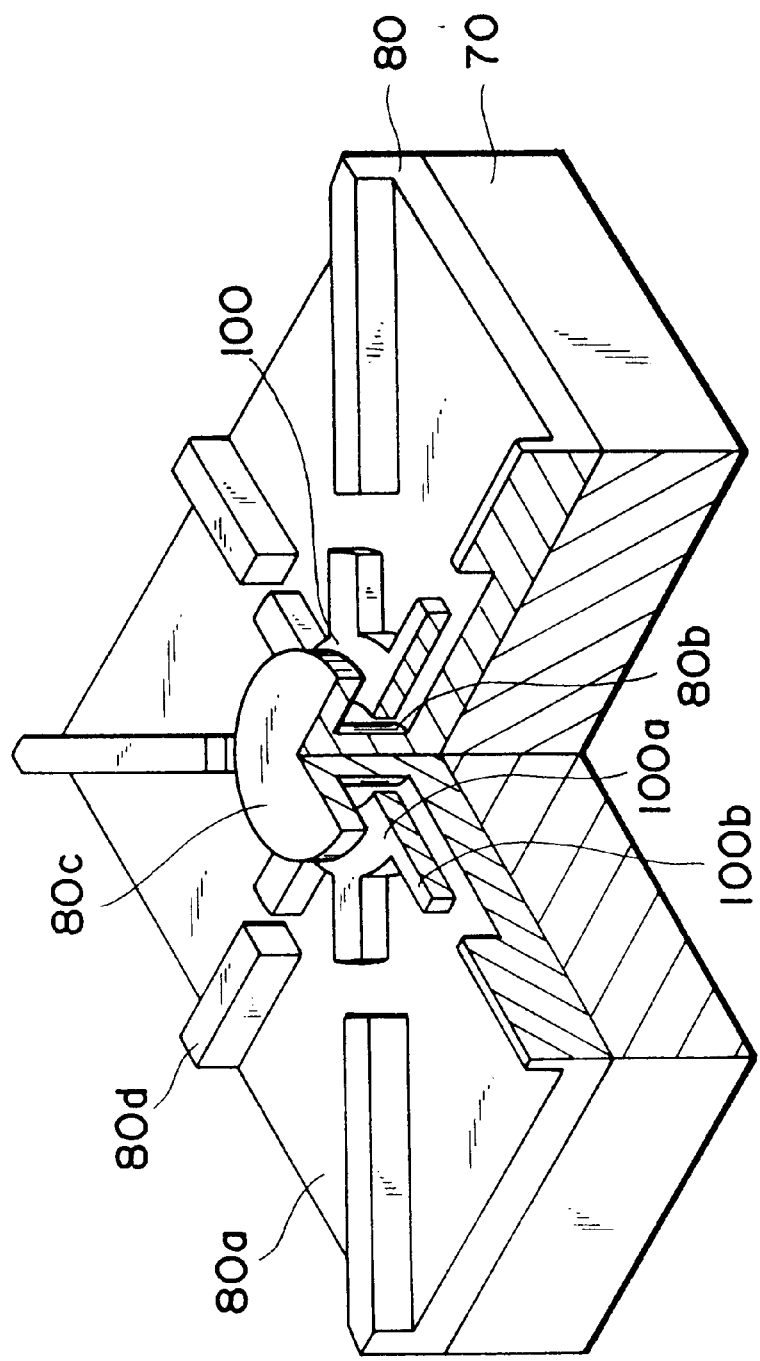
FIG. 9 is a perspective view to show structure of a gear in a fourth embodiment according to the present invention.

FIG. 9 is a perspective view, partly broken, to show structure of a gear in the present embodiment. In this gear, an i-type diamond layer 80 is laid on the top surface of substrate 70. The i-type diamond layer 80 is integrally constructed of a support portion 80a of a flat plate, a shank 80b of a circular cylinder, a stopper 80c of a disk, and peripheral portions 80d each of a rectangular prism. The support portion 80a is formed in such an arrangement that the entire back surface is placed on the top surface of substrate 70. The shank 80b is formed in such a manner that the axis thereof is vertically upright on the central region of the surface of support portion 80a. The stopper 80c is formed on the top of the shank 80b so that the axis thereof coincides with the axis of shank 80b. The peripheral portions 80d are formed on the peripheral regions of the surface of support portion 80a so that axes thereof radially extend along directions perpendicular to the axis of the shank 80b.

Around the shank 80b between the support portion 80a and the stopper 80c, an i-type diamond layer 100 is formed as separate from the adjacent portions. The i-type diamond layer 100 is integrally constructed of a sleeve portion 100a of an annular plate and teeth 100b each of a rectangular prism. The shank 80b is set through a through hole, which is an internal wall concentric to an outer wall, of the sleeve portion 100a. Eight teeth 100b are formed in such an arrangement that axes thereof radially extend along directions perpendicular to the axis of sleeve portion 100a on the side wall thereof.

The substrate 70 is a chip separated out from a wafer, which is made of a semiconductor material such as Si. The i-type diamond layer 80 is formed by depositing non-doped diamond, based on the CVD process. This i-type diamond layer 80 has high resistance in dopant concentration of about $10^{14}$ cm$^{-3}$ and also has a film thickness of about 20 $\mu$m. The i-type diamond film 100 is formed by depositing non-doped diamond, based on the CVD process. This i-type diamond film 100 has high resistance in dopant concentration of about $10^{16}$ cm$^{-3}$ and a film thickness of about 10 $\mu$m.

Here, the size of substrate 70 is about 7 mm in length, about 9 mm in width, and about 1.1 mm in height. Thicknesses of support portion 80a, shank 80b, stopper 80c, and peripheral portions 80d are about 10 $\mu$m, about 11 $\mu$m, about 10 $\mu$m, and about 200 $\mu$m, respectively. Diameters of shank 80b and stopper 80c are about 20 $\mu$m and about 40 $\mu$m, respectively. Thicknesses of sleeve portion 100a and teeth 100b are about 9 $\mu$m and about 10 $\mu$m, respectively. The inner diameter and outer diameter of sleeve portion 100a are about 30 $\mu$m and about 60 $\mu$m, respectively. A distance between two teeth 100b opposed to each other is about 120 $\mu$m and a longitudinal length of each of eight teeth 100b is about 22 $\mu$m.

The size of the gear thus processed in a fine shape is desirably about 1 $\mu$m to about 10 mm in length, about 1 $\mu$m to about 10 mm in width, and about 10 $\mu$m to about 10 mm in height as a whole from the viewpoint of expansion of application range; more precisely, the size is preferably about 50 $\mu$m to about 10 mm in length, about 50 $\mu$m to about 10 mm in width, and about 50 $\mu$m to about 10 mm in height as a whole from the viewpoint of securing sufficient mechanical strength.

A thickness of each diamond thin film is desirably in the range of about 0.1 $\mu$m to about 1 mm from the viewpoint of expansion of application range; more precisely, it is desirably in the range of about 10 $\mu$m to about 1 mm from the viewpoint of securing sufficient mechanical strength.

In such a gear, a gap is secured at a predetermined margin between the inner wall of sleeve portion 100a and the side wall of the shank 80b, so that the i-type diamond film 100 rotates around the shank 80b when the teeth 100b receive an external force.

Here, the i-type diamond layer 80 functions as a base fixed to the substrate 70 while the i-type diamond layer 100 functions as a drive portion supported by the base and relatively driving thereto in response to an externally loaded stress. These two layers each are formed of a diamond thin film.

Since the i-type diamond film 100 has excellent mechanical strength and modulus of elasticity as a drive portion as in the first embodiment, operational performance as a micro gear can be greatly improved from the conventional level accordingly. Also, the i-type diamond layer 80 and i-type diamond film 100 have excellent device characteristics under severe circumstances, whereby the range of applications as a micro gear can be expanded.

A process for producing the present embodiment is next described.

Figure 10A:
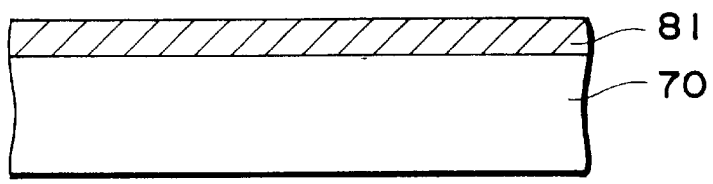
FIG. 10A to FIG. 10I are cross sections to show production steps of the gear of FIG. 9 in order.

FIG. 10A to FIG. 10I are cross sections to show production steps of the gear of the present embodiment in order. First, based on the normal CVD process, a wafer or a chip separated out from a wafer is set as substrate 70 inside the chamber, the atmosphere in the chamber is set to the pressure of about 40 Torr, and the temperature of substrate 70 is set to about 930° C. Subsequently, $H_2$ of concentration 99.9999% and $CH_4$ of concentration 99.9999% are supplied as reaction gases at a flow rate of about 200 sccm and at a flow rate of is about 1 sccm, respectively, into the chamber. Then a thermochemical reaction is induced over the surface of substrate 70 by RF radiation of frequency about 2.45 GHz and power about 400 W, thereby forming an i-type diamond layer 81 on the top surface of substrate 70 (FIG. 10A).

Figure 10B:
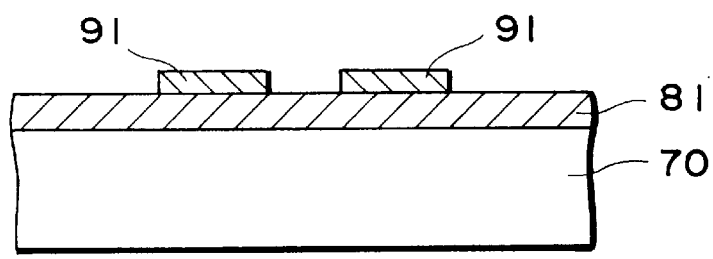

Next, based on the normal resistance heating evaporation method, the wafer or chip is set inside the heating furnace and the atmosphere in the heating furnace is set to the temperature of about 100° C. Then molybdenum or a silicon nitride is introduced into the heating furnace to be deposited over the surface of the i-type diamond layer 81, thereby forming a dummy layer 91 having a predetermined thickness. Subsequently, based on the normal photolithography technology, a mask layer of $SiO_2$ is formed in an annular pattern on the surface of dummy layer 91. Then, based on the normal RIE process, the wafer or chip is set inside the etching container, the atmosphere in the etching container is set to the pressure of about 0.02 Torr, and the temperature of substrate 70 to about 30° C. Next, Ar of concentration about 100% and $O_2$ of concentration about 100% are supplied as etching gases at a flow rate of about 100 sccm and at a flow rate of about 1 sccm, respectively, into the etching container. Then a chemical reaction is induced over the surface of the dummy layer 91 by RF radiation of frequency about 1.356 MHz and power about 100 W, thereby removing a predetermined region of the dummy layer 91 not covered with the mask material (FIG. 10B).

Figure 10C:
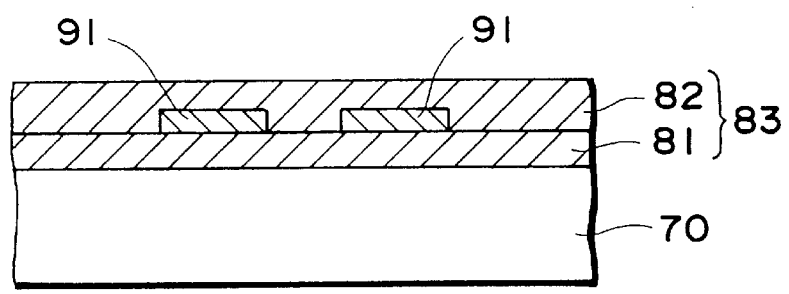

Next, based on the normal CVD process, the wafer or chip is again set inside the chamber, the atmosphere in the chamber is set to the pressure of about 40 Torr, and the temperature of substrate 70 to about 930° C. Subsequently, $H_2$ of concentration 99.9999% and $CH_4$ of concentration 99.9999% are supplied as reaction gases at a flow rate of about 200 sccm and at a flow rate of about 1 sccm, respectively, into the chamber. Then a thermochemical reaction is induced over the surfaces of the i-type diamond layer 81 and dummy layer 91 by RF radiation of frequency about 2.45 GHz and power about 400 W to form an i-type diamond layer 82 on the surfaces of the i-type diamond layer 81 and dummy layer 91 (FIG. 10C). In the following description, the i-type diamond layers 81, 82 are called as the i-type diamond layer 83 as a whole.

Figure 10D:
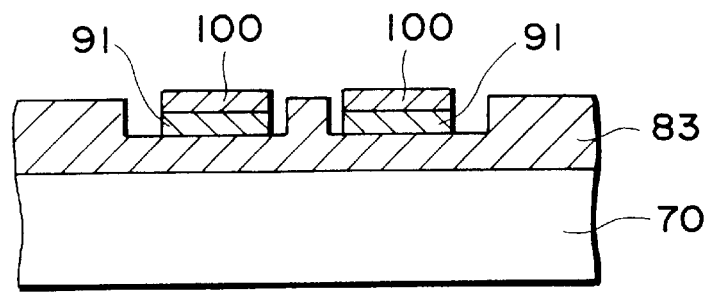

Next, based on the normal photolithography technology, a mask layer of $SiO_2$ is formed in a predetermined pattern on the surface of i-type diamond layer 83. Subsequently, based on the normal RIE process, the wafer or chip is set inside the etching container, the atmosphere in the etching container is set to the pressure of about 0.02 Torr, and the temperature of substrate 70 to about 30° C. Then Ar of concentration about 100% and $O_2$ of concentration about 100% are supplied as etching gases at a flow rate of about 100 sccm and at a flow rate of about 1 sccm, respectively, into the etching container. Next, a chemical reaction is induced over the surface of the i-type diamond layer 83 by RF radiation of frequency about 1.356 MHz and power about 100 W to remove predetermined regions of the i-type diamond layer 83 not covered with the mask material, thereby forming the i-type diamond layer 100 (FIG. 10D).

The volume percentage of $O_2$ to Ar in the etching gases is preferably about 1%. Then the etch selectivity of the i-type diamond layer 83 to the mask material of $SiO_2$ is about 40 times, and the etch rate thereof is about 15 nm/min.

Figure 10E:
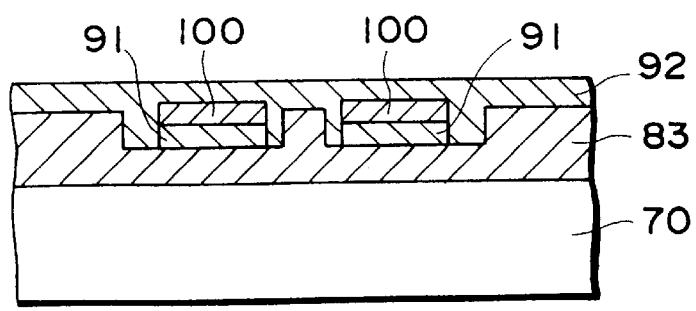

Next, based on the normal resistance heating evaporation method, the wafer or chip is again set in the heating furnace, and the atmosphere in the heating furnace is set to the temperature of about 100° C. Then molybdenum or silicon nitride is introduced into the heating furnace to be deposited on the surfaces of the i-type diamond layer 83 and i-type diamond film 100, whereby a dummy layer 92 with a predetermined thickness is formed (FIG. 10E). In the following description, the dummy layers 91, 92 are totally called as a dummy layer 90.

Figure 10F:
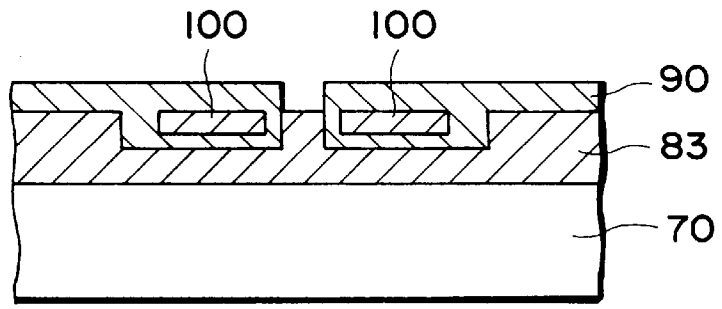

Next, based on the normal photolithography technology, a mask layer of $SiO_2$ is formed in a predetermined pattern on the surface of dummy layer 90. Subsequently, based on the normal RIE process, the wafer or chip is set inside the etching container, the atmosphere in the etching container is set to the pressure of about 0.02 Torr, and the temperature of substrate 70 to about 30° C. Then Ar of concentration about 100% and $O_2$ of concentration about 100% are supplied as etching gases at a flow rate of about 100 sccm and at a flow rate of about 1 sccm, respectively, into the etching container. Then a chemical reaction is induced over the surface of the dummy layer 90 by RF radiation of frequency about 1.356 MHz and power about 100 W to remove a predetermined region of the dummy layer 90 not covered with the mask material, which is located above the shank 80b (FIG. 10F).

Figure 10G:
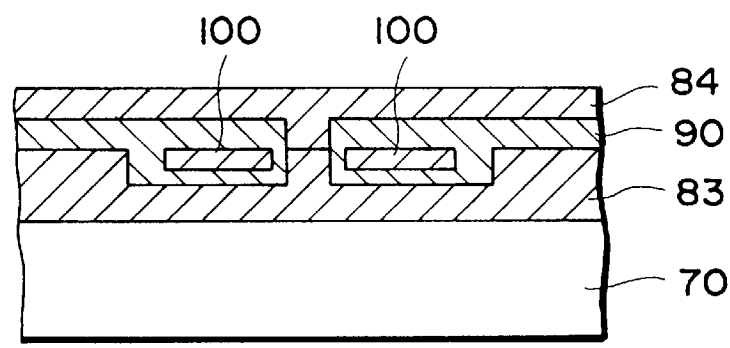

Next, based on the normal CVD process, the wafer or chip is again set in the chamber, the atmosphere in the chamber is set to the pressure of about 40 Torr, and the temperature of substrate 70 to about 930° C. Subsequently, $H_2$ of concentration 99.9999% and $CH_4$ of concentration 99.9999% are supplied as reaction gases at a flow rate of about 200 sccm and at a flow rate of about 1 sccm, respectively, into the chamber. Then a thermochemical reaction is induced over the surfaces of the i-type diamond layer 83 and dummy layer 90 by RF radiation of frequency about 2.45 GHz and power about 400 W to form an i-type diamond layer 84 on the surfaces of the i-type diamond layer 83 and dummy layer 90 (FIG. 10G). In the following description, the i-type diamond layers 83, 84 are called together as an i-type diamond layer 80.

Figure 10H:
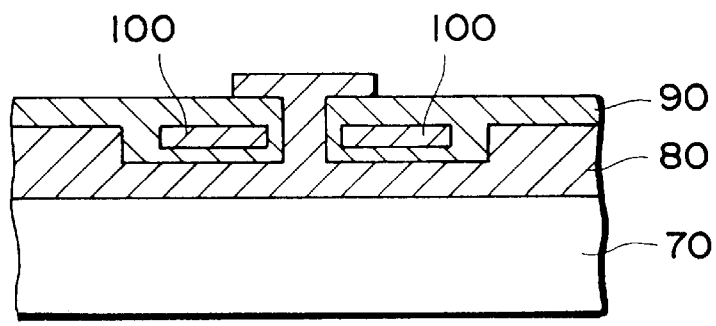

Next, based on the normal photolithography technology, a mask layer of $SiO_2$ is formed in a predetermined pattern on the surface of the i-type diamond layer 80. Subsequently, based on the normal RIE process, the wafer or chip is set inside the etching container, the atmosphere in the etching container is set to the pressure of about 0.02 Torr, and the temperature of substrate 70 to about 30° C. Then Ar of concentration about 100% and $O_2$ of concentration about 100% are supplied as etching gases at a flow rate of about 100 sccm and at a flow rate of about 1 sccm, respectively, into the etching container. Next, a chemical reaction is induced over the surface of the i-type diamond layer 80 by RF radiation of frequency about 1.356 MHz and power about 100 W to remove a predetermined region of the i-type diamond layer 80 not covered with the mask material, thus forming the stopper 80c (FIG. 10H).

Figure 10I:
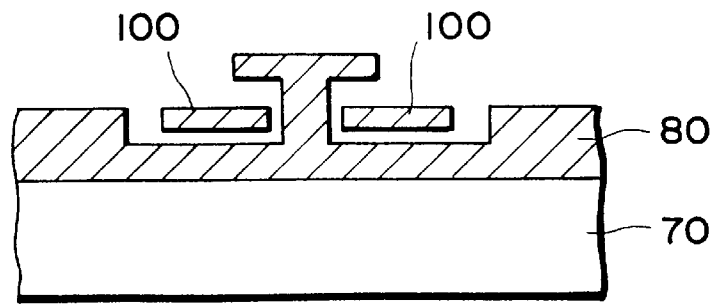

Next, based on the normal wet etching process, the wafer or chip is immersed in a HF base etchant to remove the dummy layer 90, thereby completing the gear (FIG. 10I).

By the production process of the gear, the i-type diamond layer 80 and i-type diamond film 100 are formed based on the chemical vapor phase epitaxy using the reaction gases consisting of $CH_4$ and $H_2$, whereby these diamond thin films each are densely deposited in the form of small-grain-size crystals. Thus, the i-type diamond layer 80 and i-type diamond film 100 have excellent modulus of elasticity and good mechanical strength based on a thinner and finer shape as compared with when formed of Si. Accordingly, the micro gear can be produced with greatly improved operational performance and with a greatly expanded range of applications as compared with the conventional gears.

Experiments of the present embodiment are next described.

Gas such as air was supplied between two peripheral portions 80d in the i-type diamond layer 80, so that the i-type diamond film 100 rotated at high speed around the shank 80b of the i-type diamond layer 80. This experiment showed that the gear was rarely abraded after rotation over 10 hours and thus the rotation was not stopped.

It should be noted that the present invention is by no means limited to the above embodiments, but may have a variety of modifications.

For example, the above embodiments showed the examples in which the acceleration sensor, frequency analyzer, or gear was formed of diamond in a fine pattern based on the chemical vapor phase epitaxy. However, sensors or actuators of other types can also be formed of diamond in a fine pattern based on the CVD process, achieving substantially the same effects as in the above embodiments.

In the above embodiments, molybdenum was employed for the dummy layers used in the production steps. However, the material forming the dummy layers may be either one of at least one element selected from the group consisting of Mo, Si, Ni, Ti, and W, a carbide of the element, and $SiO_2$, or either one of a nitride of at least one element selected from the group consisting of Si, Zr, Ti, Al, Ta, and W, a boride of the element, a carbide of the element, an oxide of the element, and a boron nitride. as long as the nuclear growth of diamond is caused in the nucleation density of at least about $1 \times 10^5$ to $1 \times 10^6$ cm$^{-2}$, thereby achieving substantially the same effects as in the above embodiments.

As detailed above, at least one drive portion supported on the base and relatively driving thereto is formed of diamond in the micro mechanical components of the present invention. Diamond is effective as a material to show good device characteristics under severe circumstances, for example at a high temperature or with strong radiation, effective as a material to show good performance characteristics, for example high frequency or large output, and effective as a material to show good mechanical strength even in a thinner and finer shape as compared with Si etc. Therefore, because the drive portion has excellent mechanical strength and modulus of elasticity, the operational performance is greatly improved as a micro mechanical component processed in a fine shape as compared with the conventional components. Further, because the drive portion has excellent device characteristics under severe circumstances, the range of applications as a micro mechanical component is greatly expanded from the conventional range. Further, if the base is formed of diamond, the operational performance and application range are further improved as a micro mechanical component.

In the production processes of the micro mechanical components of the present invention, the drive portion is formed by depositing diamond on the base, based on the chemical vapor phase epitaxy, whereby the diamond thin film is densely deposited in the form of small-grain-size crystals. Thus, the drive portion has excellent modulus of elasticity and good mechanical strength even in a thinner and finer shape as compared with when formed of Si. Accordingly, the micro mechanical components can be produced with greatly improved operational performance and with a widely expanded application range as compared with the conventional components. Further, when the base is formed by depositing diamond on the substrate, based on the chemical vapor phase epitaxy, the micro mechanical components can be produced with further improved operational performance and application range.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

The basic Japanese Application No. 54047/1994 filed on Mar. 24, 1994 is hereby incorporated by reference.

What is claimed is:

1. A process for producing a micro mechanical component, comprising the steps of:
    forming a dummy layer having a first shape and a thickness coincident with a predetermined interelectrode gap, and a promoting effect on nuclear growth of diamond on a base;
    forming a diamond layer having a second shape inversion of the first shape, on the base including the dummy layer by a vapor-phase synthesis method; and
    thereafter removing the dummy layer by a wet etching method to form a driving unit.

2. A process for producing a micro mechanical component, according to claim 1, wherein said dummy layer made of either one of at least one element selected from the group consisting of Mo, Si, Ni, Ti, and W, a carbide of said element, and $SiO_2$.

3. A process for producing a micro mechanical component, according to claim 1, wherein said dummy layer made of either one of a nitride of at least one element selected from the group consisting of Si, Zr, Ti, Al, Ta, and W, a boride of said element, a carbide of said element, an oxide of said element, and a boron niride.

4. A process for producing a micro mechanical component, according to claim 1, wherein said base is formed on a substrate by a vapor-phase synthesis method.

5. A process for producing a micro mechanical component, according to claim 1, wherein said diamond layer has a thickness of not more than 1 mm.

6. A process for producing a micro mechanical component, according to claim 1, wherein said diamond layer has conductivity.

7. A process for producing a micro mechanical component, said process comprising the steps of:
    forming a beam portion formed by lamination of a p-type diamond layer and an i-type diamond layer with a film made of either one of a ceramic material and a metallic carbide therebetween; and
    joining said i-type diamond layer and p-type layer to each other by an indirect joining method.

* * * * *